United States Patent
Zein et al.

(10) Patent No.: US 6,435,881 B1
(45) Date of Patent: Aug. 20, 2002

(54) DEVICE FOR THE ELECTRICAL AND MECHANICAL CONNECTION OF TWO PRINTED CIRCUIT BOARDS

(75) Inventors: Walter Zein, Metzingen; Ralf Schmid, Kaltental; Martin Frey, Lichtenstein, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/868,675
(22) PCT Filed: Oct. 20, 2000
(86) PCT No.: PCT/DE00/03697
§ 371 (c)(1),
(2), (4) Date: Dec. 6, 2001
(87) PCT Pub. No.: WO01/29928
PCT Pub. Date: Apr. 26, 2001

(30) Foreign Application Priority Data

Oct. 21, 1999 (DE) .......................................... 199 50 757

(51) Int. Cl.[7] .............................................. H01R 12/00
(52) U.S. Cl. .......................................... 439/65; 439/493
(58) Field of Search ............................ 439/65, 493, 67, 439/77, 78–84

(56) References Cited

U.S. PATENT DOCUMENTS

| | | | | |
|---|---|---|---|---|
| 3,980,367 A | * | 9/1976 | Laserson et al. | 439/83 |
| 4,012,093 A | * | 3/1977 | Crane | 439/67 |
| 4,358,173 A | * | 11/1982 | Conrad | 439/71 |
| 4,453,795 A | * | 6/1984 | Moulin | 439/361 |
| 4,645,280 A | * | 2/1987 | Gordon et al. | 439/77 |
| 4,948,374 A | * | 8/1990 | Carter | 439/67 |
| 5,743,747 A | * | 4/1998 | Sobhani | 439/67 |

* cited by examiner

Primary Examiner—P. Austin Bradley
Assistant Examiner—Ross Gushi
(74) Attorney, Agent, or Firm—Ronald E. Greigg

(57) ABSTRACT

A device for the electrical and mechanical connection of a first, preferably elastically flexible printed circuit board to a second printed circuit board wherein an electrically conductive contact pin, protruding from the second printed circuit board and projecting through an opening in the first printed circuit board, is electrically conductively connected to a conductor track of the first printed circuit board. The device further includes an electrically conductive clamping part with elastically flexible protrusions embodied on it that embrace the contact pin by nonpositive engagement, and a bearing region of the clamping part that is electrically connected to the protrusions is pressed in prestressed fashion against a conductor track disposed on the first printed circuit board.

14 Claims, 1 Drawing Sheet

DEVICE FOR THE ELECTRICAL AND MECHANICAL CONNECTION OF TWO PRINTED CIRCUIT BOARDS

CROSS-REFERENCE TO RELATED APPLICATIONS

This application is a 35 USC 371 application of PCT/DE 00/03697 filed on Oct, 20, 2000.

BACKGROUND OF THE INVENTION

1. Field of the Invention

The invention relates to a device for the electrical and mechanical connection of two printed circuit boards.

2. Description of the Prior Art

One such device is known for instance from the article entitled "Leiterplatten flexibel verbinden" ["Connecting printed circuit boards flexibly"], in *Feinwerktechnik & Meßtechnik* 1991, pages 204–205, and includes electrically conductive contact pins which are electrically connected to the conductor tracks of a rigid printed circuit board. The contact pins protrude vertically from the rigid printed circuit board and are optionally further stabilized by a plastic substrate. The end of each of the contact pins that protrudes from the rigid printed circuit board is passed through a respective opening in an elastically flexible film- type printed circuit board and soldered to the conductor tracks on the back side of the film-type printed circuit board. Other devices include contact-pressure connectors or plug-type connectors. A disadvantage of the known devices is the complicated assembly and major effort for producing the contacting means which greatly increase the costs. Soldering the contact pins to the conductor tracks of the elastically flexible film-type printed circuit board, in particular, necessitates one additional soldering process. In the event of mechanical stresses on the soldered connections, which result for instance from vibrational or tensile stresses on the film-type printed circuit board, the soldered connections can rapidly be damaged, making such connections no longer reliable.

SUMMARY OF THE INVENTION

With the device of the invention the disadvantages known from the prior art are avoided, and an economical, reliable connection of two printed circuit boards is made possible. Advantageously, the device comprises two parts that are simple to produce. A considerable simplification of assembly results from the fact that a first, preferably elastically flexible printed circuit board can be secured with only a few manipulations securely to a second printed circuit board by the use of the clamping part and the contact pin cooperating with it. The device is very sturdy and reliable, and under vibrational and jarring stresses on the first printed circuit board, it advantageously forms a tension relief for the second printed circuit board because of the elastic flexibility of the clamping part. The clamping part and the contact pin can be produced economically by simple techniques.

An especially reliable fixation of the clamping part to the contact pin is attained in that the clamping part has a recess for leading the contact pin through, from the inner edge of which recess, clawlike protrusions extend toward the contact pin and embrace it on all sides.

It is also advantageous that the recess is surrounded by an annularly embodied portion of the clamping part, which portion, on its outer edge remote from the recess, is bent back toward the recess in such a way that the underside of the backward-bent portion forms an annular bearing region of the clamping part for resting on the first printed circuit board. As a result of the bending, the bearing region is movable relative to the annularly embodied region and always presses itself flat against the conductor track of the first printed circuit board.

It especially advantageous that the clamping part has an encompassing groove, and that the clamping part can be fixed in the opening of the first printed circuit board in such a way that the inner edge of the opening engages the encompassing groove. As a result, the clamping part can be pre-mounted on the first printed circuit board, which facilitates assembly considerably. The first printed circuit board can be firmly clamped in the encompassing groove, so that the clamping part is reliably connected electrically to a conductor track, surrounding the opening, of the first printed circuit board.

It is also advantageous that the portion bent back toward the recess is bent back again in such a way that a further reversely-bent portion extends approximately parallel to the bearing region of the clamping part, and the portion bent back toward the recess and the further reversely-bent portion simultaneously form the side walls of the groove.

Advantageously, the side, remote from the groove, of the further reversely-bent portion forms a second bearing region of the clamping part for resting on the second printed circuit board.

It is also advantageous if axially extending lateral grooves for engagement with the elastically flexible protrusions of the clamping part are embodied on the contact pin and are embodied as closed on their end remote from the second printed circuit board. The grooves enable a reliable embracing of the contact pin, and the closed ends of the grooves form detent edges, behind which the elastically flexible protrusions of the clamping part engage the grooves in barblike fashion. This advantageously prevents a mistaken release or snapping off of the clamping part.

Advantageously, by the nonpositive contact of the elastically flexible protrusions with the contact pin, a force introduction to the bearing region is brought about, so that the bearing region is firmly pressed against the conductor track of the first printed circuit board.

The clamping part can advantageously be embodied in one piece. In a preferred exemplary embodiment, the clamping part is embodied as a stamped and bent part of sheet metal.

However, it is also conceivable to design the clamping part as an elastically flexible plastic part, which is provided with an electrically conductive coating.

BRIEF DESCRIPTION OF THE DRAWINGS

One exemplary embodiment of the invention is described herein below, with reference to the drawings, in which.

Figure 1:
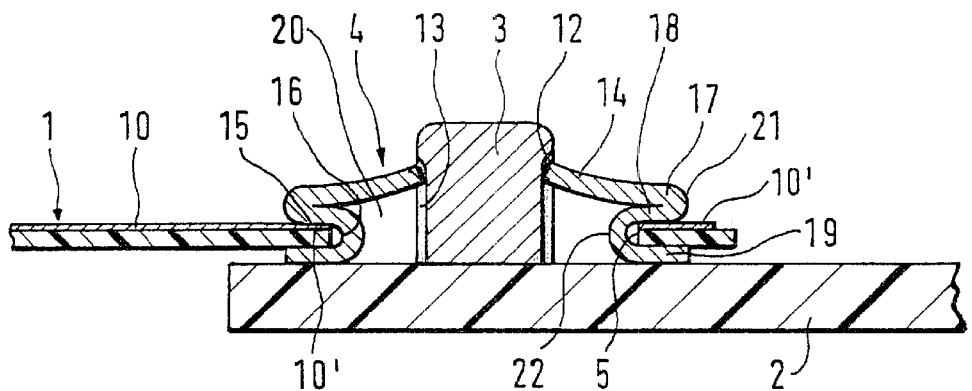
FIG. 1 is a cross section through the device of the invention connecting two printed circuit boards.
Figure 2:
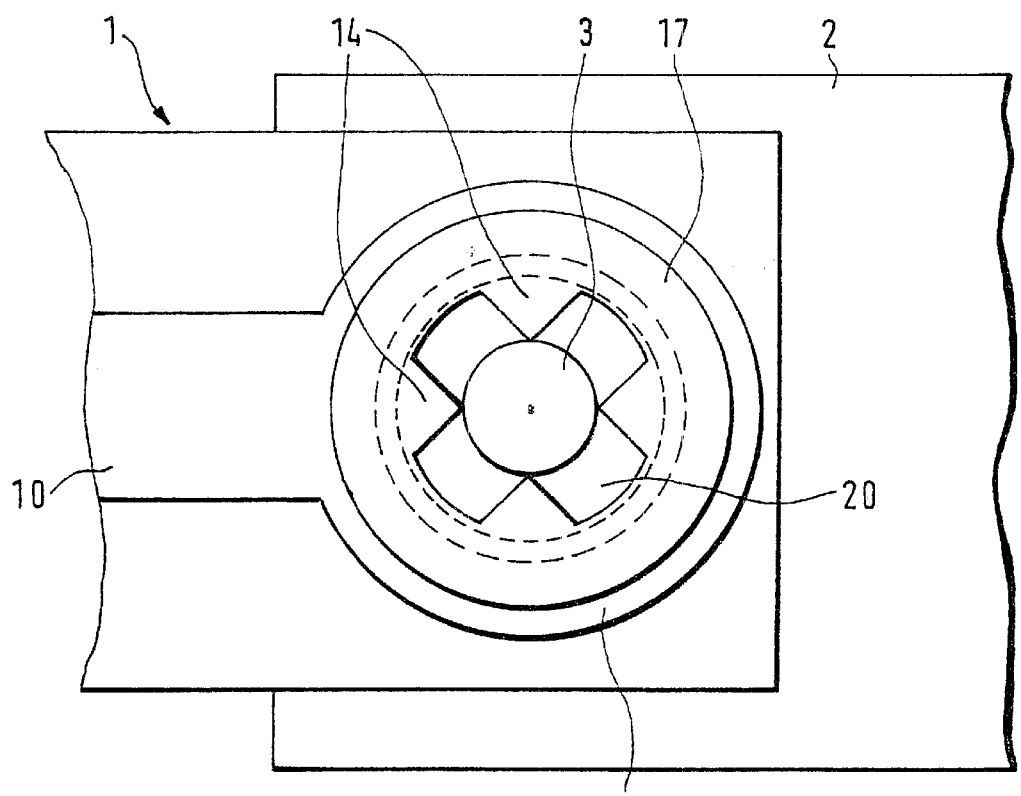
FIG. 2, a plan view on FIG. 1.

DESCRIPTION OF THE PREFERRED EMBODIMENT joined to one another via the bends 21, 22 form an S-shaped contour. The annular portions 18 and 19 joined together via the bend 22 also form an encompassing groove 16, which is engaged by the edge of the opening 5 of the printed circuit board 1. In order to fix the clamping part 4 to the printed circuit board 1, either the elasticity of the film-type printed circuit board 1 can be exploited, or the procedure is such that first the clamping part 4 is inserted into the opening 5 with the portion 19 still unbent, and then the portion 19 is bent in flangelike fashion around the opening 5. This can be done in such a way that the bearing region 15 of the clamping part 4 is pressed firmly against the circular-annular end 10' of the conductor track 10, so that the clamping part 4 is electrically conductively connected to the conductor track 10.

For fixing the first printed circuit board 1 to the second printed circuit board 2, the procedure is then such that the contact pin 3 of the second printed circuit board is first thrust through the opening 5 of the first printed circuit board 1 and then through the recess 20 of the clamping part 4. In the process, the elastically flexible protrusions 14 initially spread backward, on the end of the contact pin remote from the second printed circuit board 2, and finally, with their pointed ends, engage the grooves 13 in barblike fashion from behind the detent edges 12 of the grooves 13, and the contact pin is then embraced on all sides by the protrusions 14. Via the contact pin 3, the protrusions 14, and the bearing region 15, the second printed circuit board 2 is brought into electrical contact with the first printed circuit board 1.

It is advantageous to dimension the axial length of the contact pin 3 and the clamping part 4 such that the protrusions 14 cannot engage the detent edges 12 from behind until the circular-annular portion 19 of the clamping part 4 has already come into contact with the second printed circuit board 2. The protrusions 14 must then be pressed manually in the direction of the second printed circuit board, so that they can catch behind the detent edges 12. As a result, it can be attained that the portion 19 is prestressed against the second printed circuit board 2, and the bearing region 15 is prestressed against the conductor track of the first printed circuit board, since the protrusions 14 resting on the detent edges 12 in prestressed fashion then bring about an introduction of force to the bearing region 15. In this case, the clamping part 4 simultaneously acts as a tensioning part.

In another exemplary embodiment, the encompassing groove 16 can also be omitted. Then the first printed circuit board 1 rests directly on the second printed circuit board 2. In that case, it is necessary for the bearing region 15 of the clamping part 4, as described above, to be prestressed against the conductor track 10 by then tensioning force of the elastically flexible protrusions 14, because otherwise no reliable electrical contact is created.

The axial grooves 13, embodied on the contact pin 3 and having the detent edges 12, can also be omitted if the tensioning force of the protrusions 14 suffices to press them firmly against the contact pin 3. If the contact pin 3 is made from a softer material than the clamping part 4, then the protrusions 14 can dig into the contact pin with their sharp-edged tips.

The foregoing relates to preferred exemplary embodiment of the invention, it being understood that other variants and embodiments thereof are possible within the spirit and scope of the invention, the latter being defined by the appended claims.

What is claimed:

1. A device for the electrical and mechanical connection of a first, preferably elastically flexible printed circuit board (1) to a second printed circuit board (2), the device comprising an electrically conductive contact pin (3), protruding from the second printed circuit board (2) and projecting through an opening (5) in the first printed circuit board (1) and electrically conductively connected to a conductor track (10) of the first printed circuit board (1), an electrically conductive clamping part (4) with elastically flexible protrusions (14) embodied on it that embrace the contact pin (3) by nonpositive engagement, and a bearing region (15) of the clamping part (4) that is electrically connected to the protrusions (14) is pressed in prestressed fashion against a conductor track (10) disposed on the first printed circuit board (1).

2. The device of claim 1, wherein said clamping part (4) has an encompassing groove (16), and that the clamping part (4) can be fixed in the opening (5) of the first printed circuit board (1) in such a way that the inner edge of the opening (5) engages the encompassing groove (16).

3. The device of claim 1, wherein by the nonpositive contact with the contact pin (3), the elastically flexible protrusions (14) effect an introduction of force to the bearing region (15), so that the bearing region (15) is pressed against the conductor track (10) of the first printed circuit board (1).

4. The device of claim 1, wherein said clamping part (4) has a recess (20) for leading the contact pin (3) through, from the inner edge of which recess, clawlike protrusions (14) extend toward and embrace the contact pin (3) on all sides.

5. The device of claim 4, wherein said recess (20) is surrounded by an annularly embodied portion (17) of said clamping part (4), which portion (17), on its outer edge remote from said recess (20), is bent back toward said recess (20) in such a way that the underside of the bent-back portion (18) forms an annular bearing region (15) of the clamping part (4) for resting on the first printed circuit board (1).

6. The device of claim 5, wherein said clamping part (4) has an encompassing groove (16), and that the clamping part (4) can be fixed in the opening (5) of the first printed circuit board (1) in such a way that the inner edge of the opening (5) engages the encompassing groove (16), and wherein said portion (18) bent back toward the recess (20) is bent back again in such a way that a further reversily-bent portion (19) extends approximately parallel to the bearing region (15) of the clamping part (4), and the portion (18) bent backward toward the recess (20) and the further reversily-bent portion (19) simultaneously form the side walls of the groove (16).

7. The device of claim 6, wherein the side, remote from the groove (16), of the further backward- bent portion (19) forms a second bearing region of the clamping part (4) for resting on the second printed circuit board (2).

8. The device of claim 6, wherein said clamping part (4) is embodied in one piece.

9. The device of claim 13, further comprising axially extending lateral grooves (13) for engagement with the elastically flexible protrusions (14) of the clamping part (4) are embodied on the contact pin (3) and are embodied as closed on their end remote from the second printed circuit board (2).

10. The device of claim 9, wherein said closed ends (12) of the grooves (13) form detent edges, behind which the elastically flexible protrusions (14) of the clamping part (4) engage the grooves (13) in barblike fashion.

11. The device of claim 9, wherein said clamping part (4) is embodied in one piece.

12. The device of claim 1, wherein said clamping part (4) is embodied in one piece.

13. The device of claim 12, wherein said clamping part (4) is embodied as a stamped and bent part of sheet metal.

14. The device of claim 12, wherein said clamping part (4) is an elastically flexible plastic part, onto which an electrically conductive coating is applied.

* * * * *